(12) United States Patent
Chung

(10) Patent No.: US 7,905,732 B2
(45) Date of Patent: Mar. 15, 2011

(54) ELECTRICAL JUNCTION BOX

(75) Inventor: Sanghee Chung, Yokkaichi (JP)

(73) Assignee: Sumitomo Wiring Systems, Ltd., Mie (JP)

( * ) Notice: Subject to any disclaimer, the term of this patent is extended or adjusted under 35 U.S.C. 154(b) by 35 days.

(21) Appl. No.: 12/314,055

(22) Filed: Dec. 3, 2008

(65) Prior Publication Data
US 2009/0156024 A1    Jun. 18, 2009

(30) Foreign Application Priority Data

Dec. 18, 2007    (JP) ................. 2007-326451

(51) Int. Cl.
*H01R 12/00* (2006.01)

(52) U.S. Cl. ................. 439/76.2; 439/620.27

(58) Field of Classification Search .......... None
See application file for complete search history.

(56) References Cited

U.S. PATENT DOCUMENTS

| | | | |
|---|---|---|---|
| 5,046,960 A * | 9/1991 | Fedder | 439/108 |
| 5,766,026 A * | 6/1998 | Cooper et al. | 439/76.1 |
| 6,371,772 B1 * | 4/2002 | Yoneyama et al. | 439/79 |
| 6,371,812 B1 * | 4/2002 | Daikuhara et al. | 439/607.09 |
| 6,447,326 B1 * | 9/2002 | Teach et al. | 439/460 |
| 6,648,696 B2 * | 11/2003 | Zemanik | 439/682 |
| 6,666,723 B2 * | 12/2003 | Fukumori et al. | 439/620.26 |
| 6,837,720 B2 * | 1/2005 | Hicks et al. | 439/79 |
| 6,939,154 B2 * | 9/2005 | Horikoshi et al. | 439/247 |
| 7,065,871 B2 * | 6/2006 | Minich et al. | 29/882 |
| 7,316,574 B2 * | 1/2008 | Che et al. | 439/76.1 |
| 7,473,109 B2 * | 1/2009 | Horikiri | 439/79 |
| 7,566,230 B2 * | 7/2009 | Ozawa et al. | 439/76.2 |
| 7,591,654 B2 * | 9/2009 | Neumetzler | 439/79 |
| 2005/0059275 A1 * | 3/2005 | Swantner et al. | 439/79 |
| 2010/0041266 A1 * | 2/2010 | Data et al. | 439/358 |

FOREIGN PATENT DOCUMENTS

JP    A-2007-259571    10/2007

* cited by examiner

*Primary Examiner* — Michael C Zarroli
(74) *Attorney, Agent, or Firm* — Oliff & Berridge, PLC

(57) ABSTRACT

An electrical junction box that can enhance reliability in connection between terminal metals and a circuit board includes a casing, a circuit board contained in the casing, a plurality of fuse side terminal metals including board connecting portions electrically coupled to the circuit board, terminal portions adapted to detachably receive fuses in a direction along a surface of the circuit board; and a holder for holding the plural terminal metals in an alignment manner. Each of the fuse side terminal metals is provided with a leg projecting toward the circuit board and is disposed forward of each board connecting portion in a detachable direction of each fuse. The circuit board is provided with through-holes that receive the legs.

6 Claims, 21 Drawing Sheets

[Fig. 9]
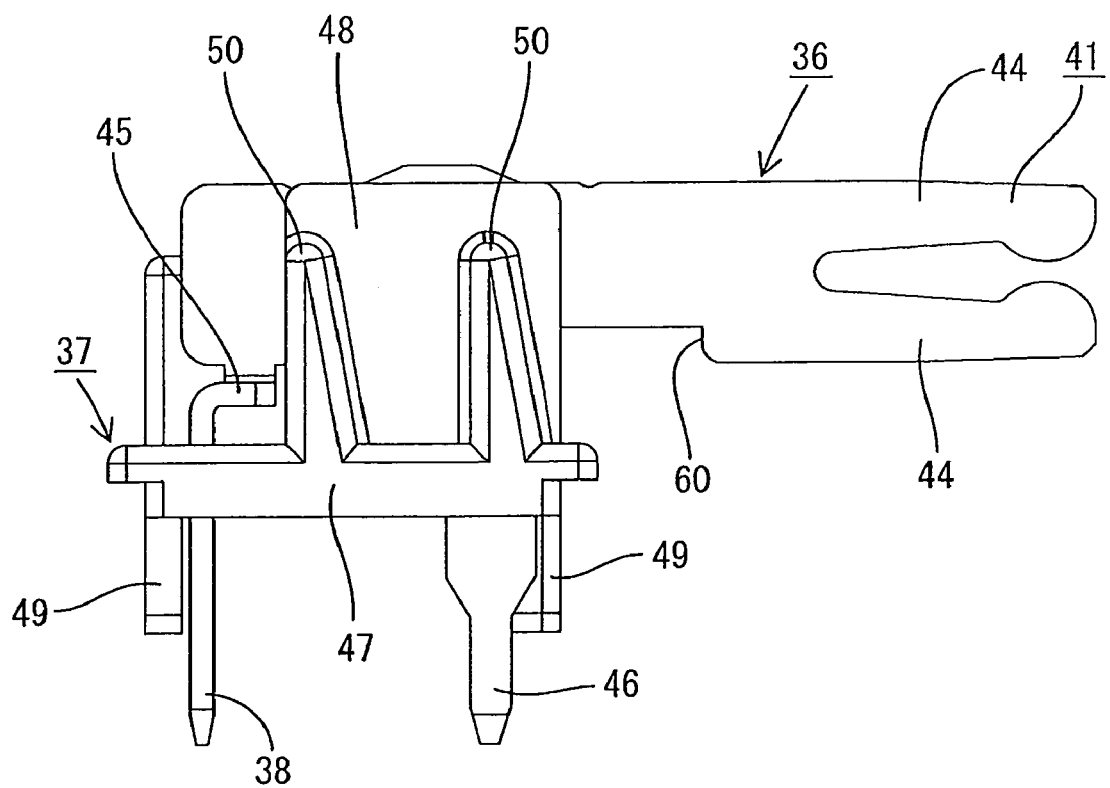

[Fig. 10]
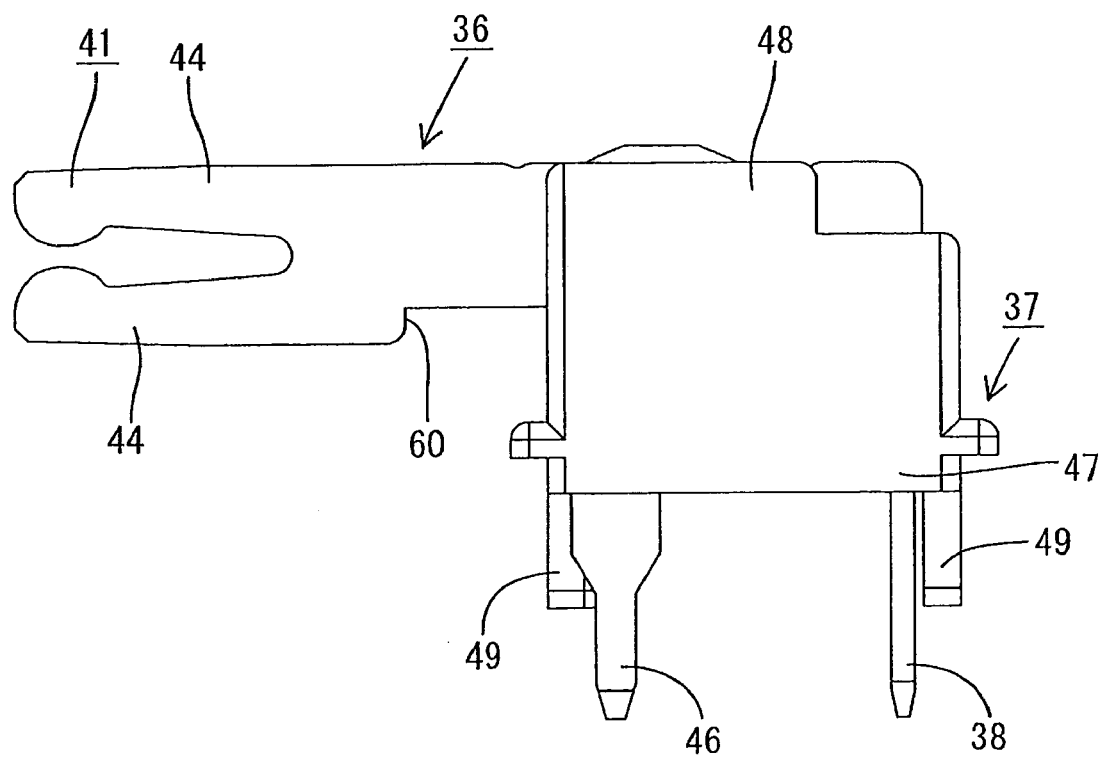

[Fig. 11]
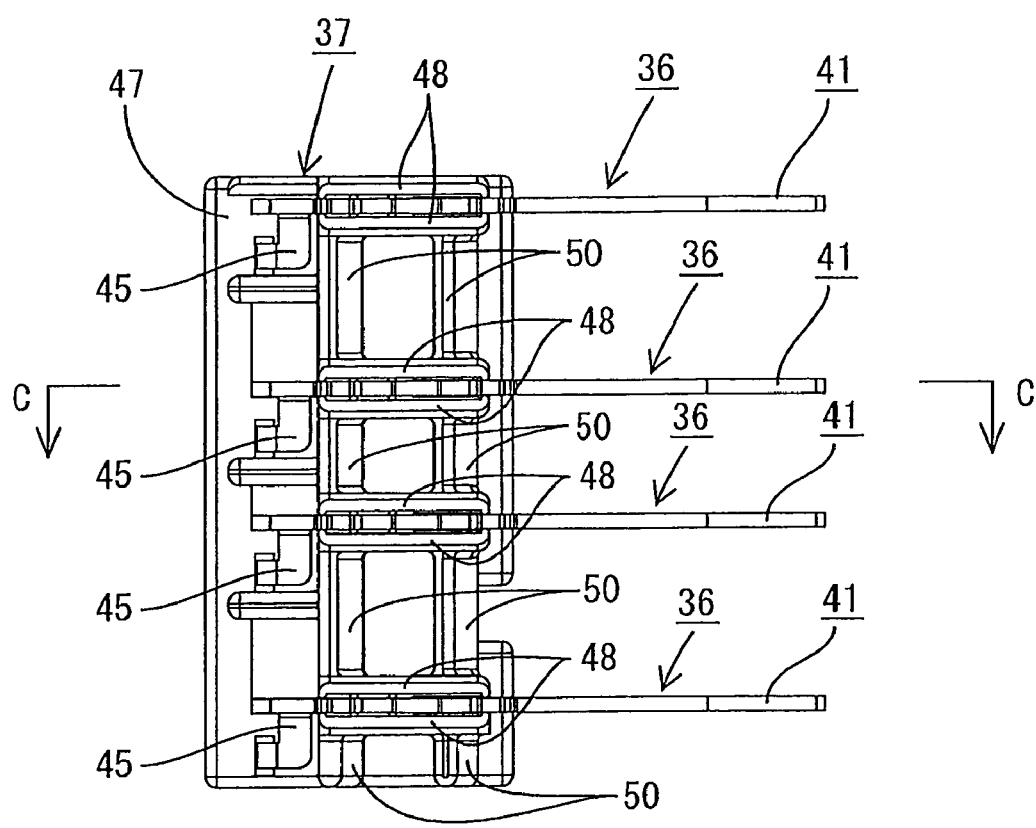

[Fig. 12]
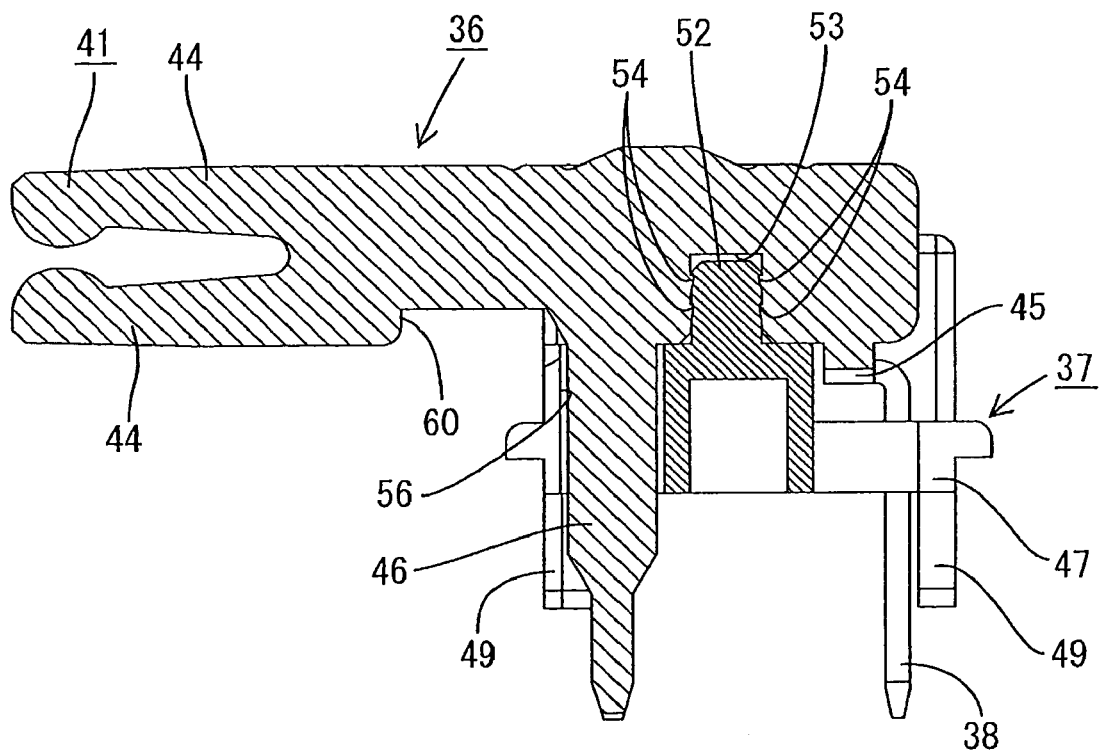

[Fig. 13]
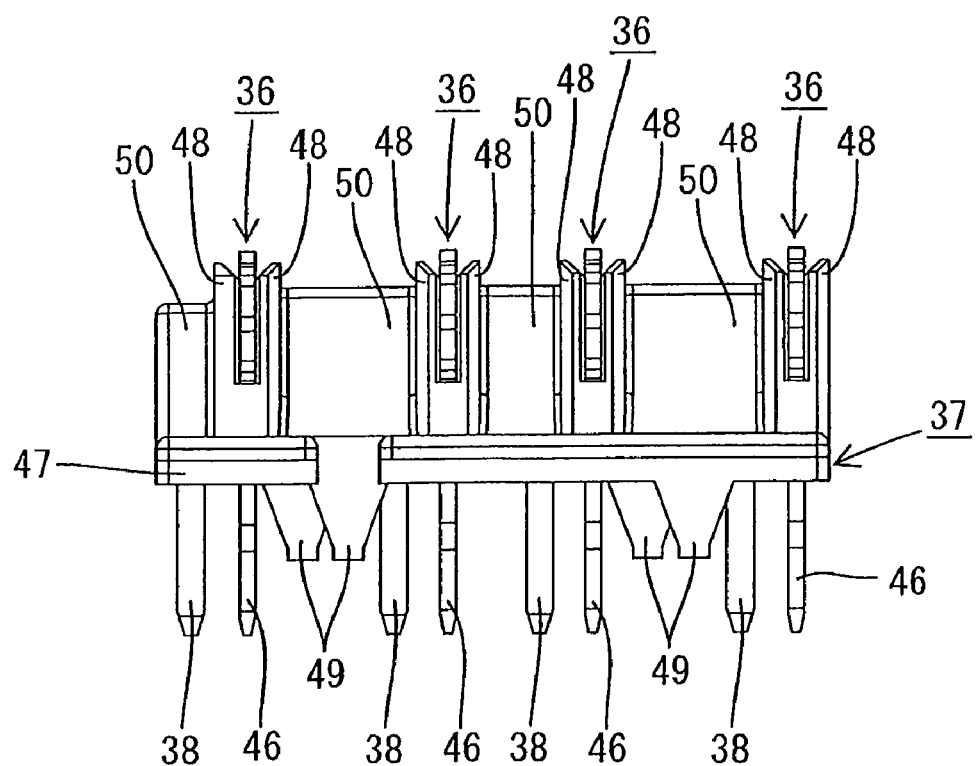

[Fig. 14]
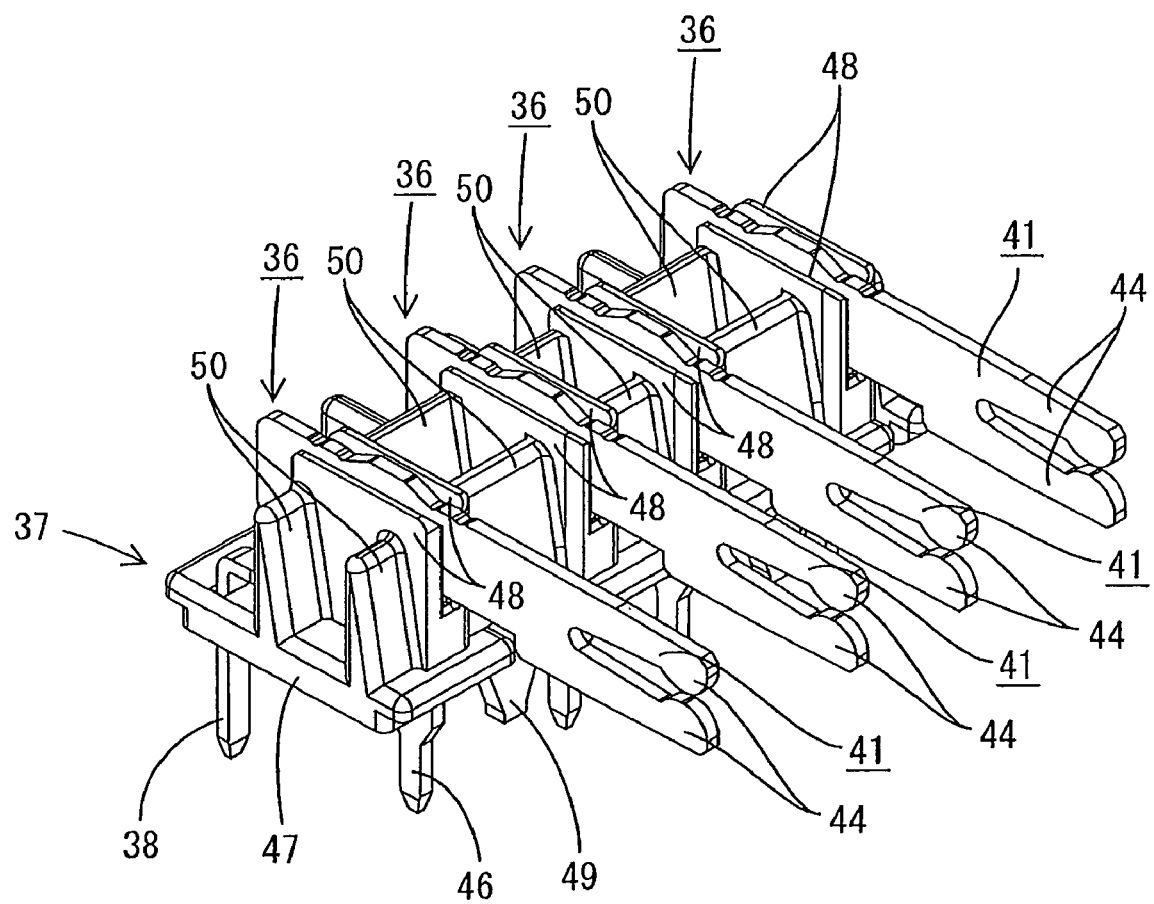

[Fig. 15]
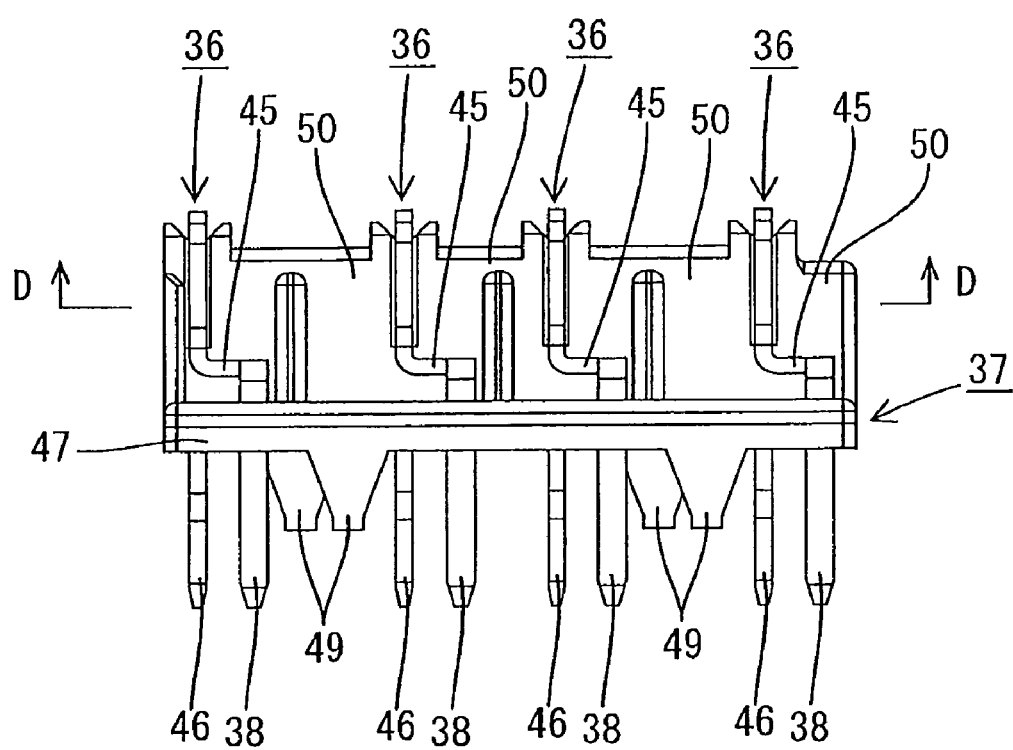

[Fig. 16]
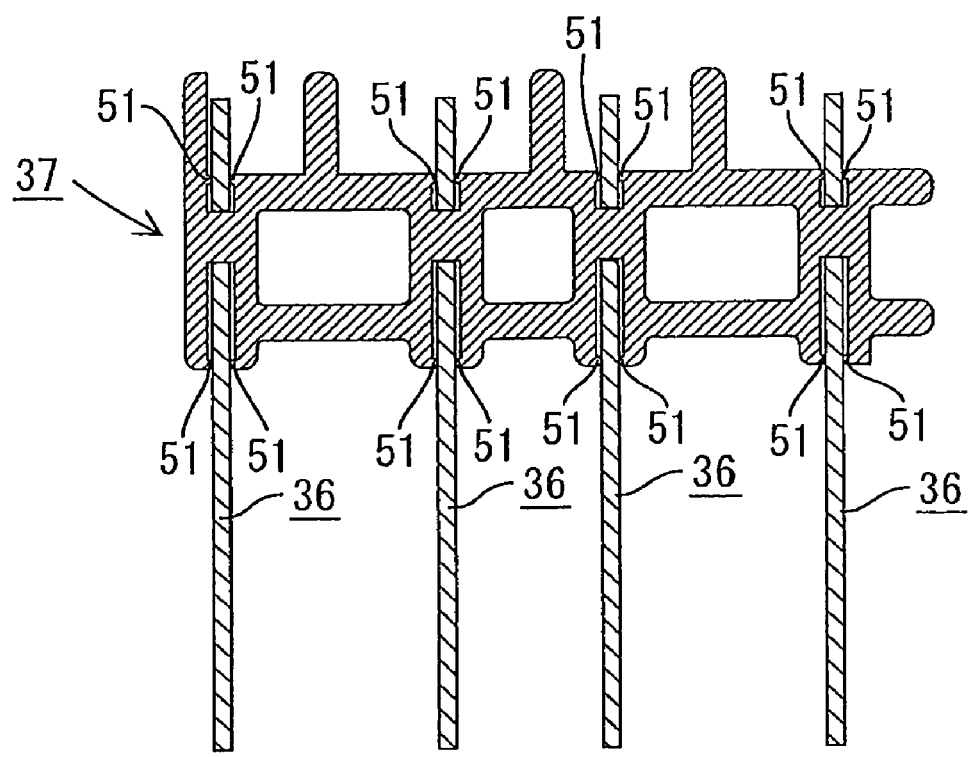

[Fig. 17]
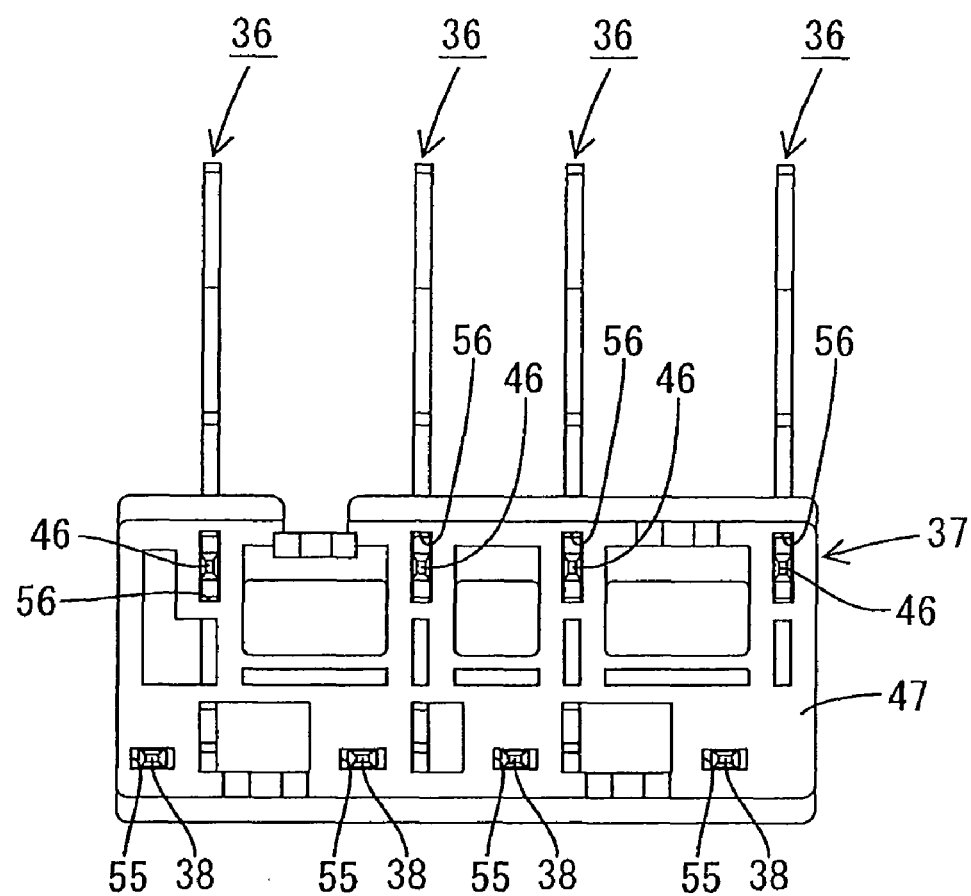

[Fig. 18]
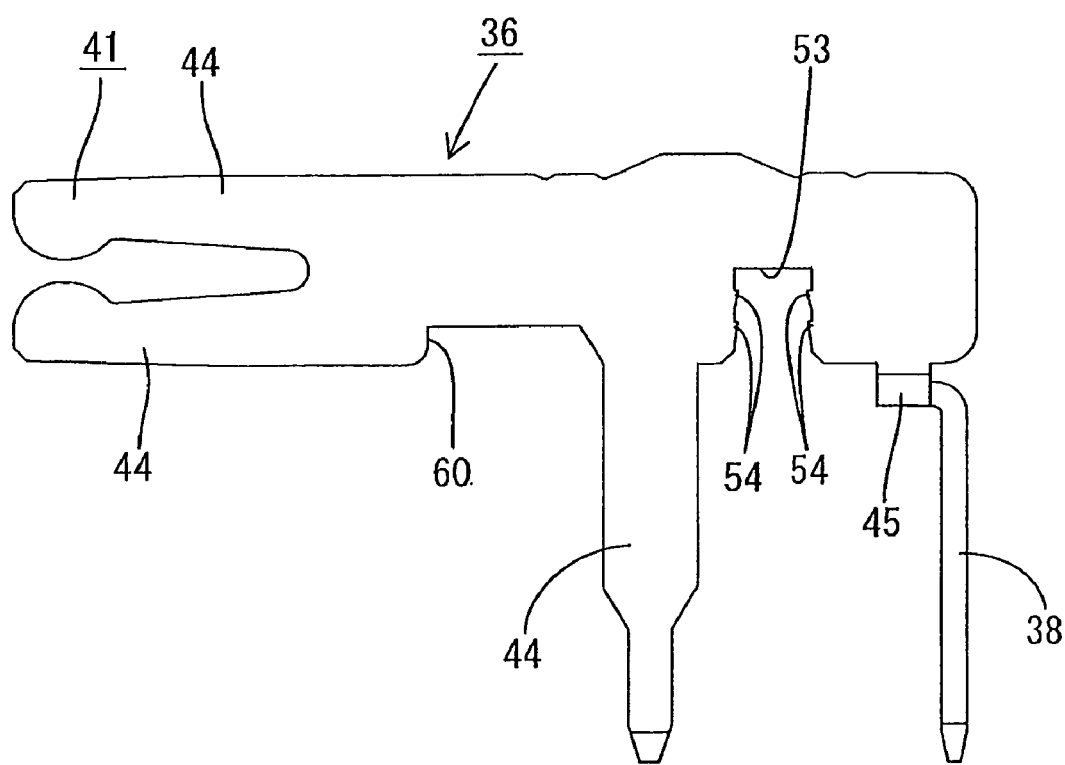

[Fig. 19]
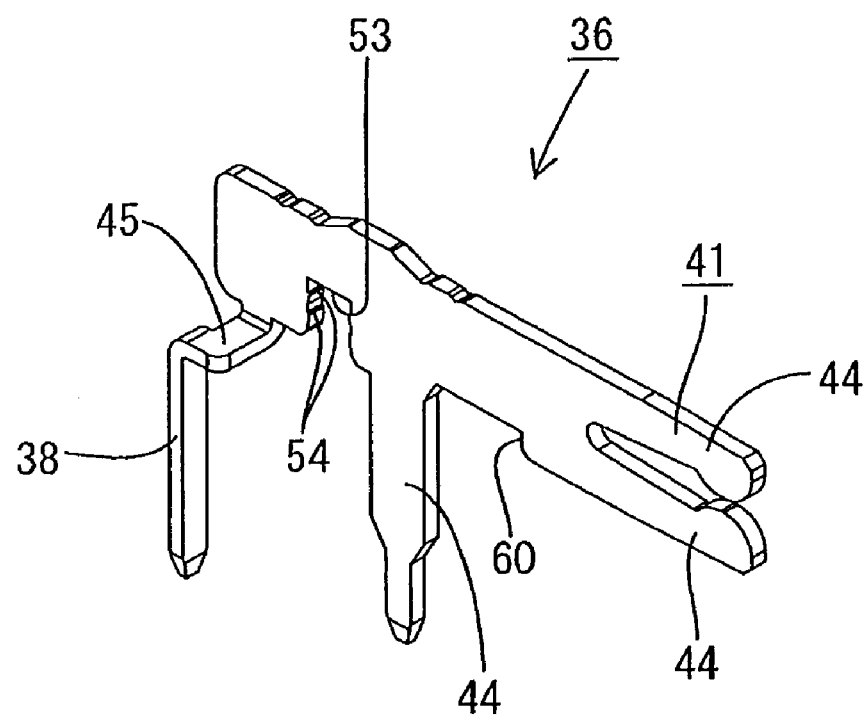

[Fig. 20]
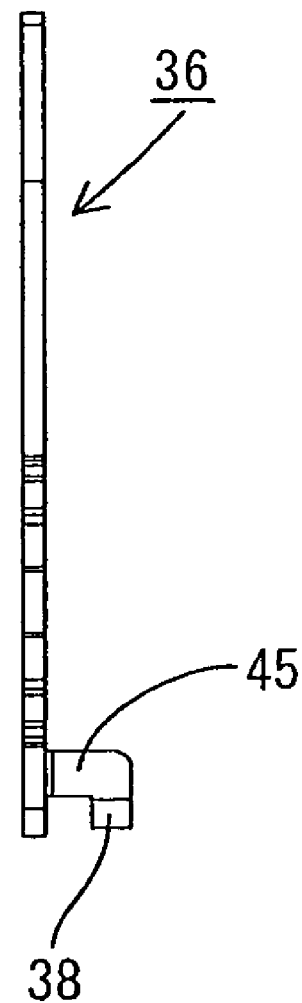

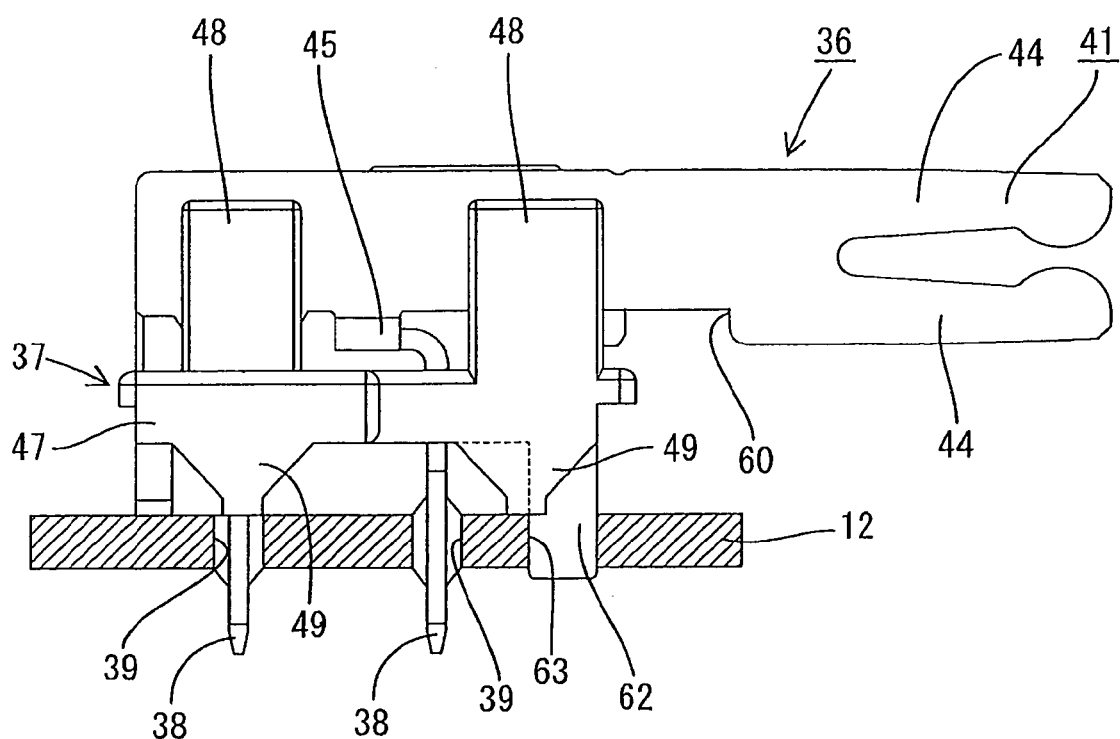
[Fig. 21]

ELECTRICAL JUNCTION BOX

This application claims priority to JP2007-326451 filed in Japan on Dec. 18, 2007, the entire disclosure of which is hereby incorporated by reference in its entirety.

BACKGROUND

This invention relates to an electrical junction box.

Heretofore, an electrical junction box has been known, as disclosed in JP 2007-259571 A. This electrical junction box includes a casing and a circuit board contained in the casing. A plurality of terminal metals are disposed on the circuit board. The terminal metals include board connecting portions connected to the circuit board and terminal portions for detachably receiving mating connectors in a direction along the surface of the circuit board. The terminal portions project into a connector section provided in the casing.

SUMMARY

However, according to the above construction, when the mating connector is attached to and detached from the connector section, an attaching or detaching force from the mating connector is applied to the terminal portions of the terminal metals in an attaching or detaching direction (a direction along the circuit board). Then, a force is applied through the terminal metals to connection portions between the board connecting portions and the circuit board. Consequently, for example, in the case where the board connecting portions and circuit board are soldered to each other, there is a possibility that cracks will be caused in the soldered portions. This may lower the reliability of the connection between the terminal metals and the circuit board.

In view of the above problems and other problems, the exemplary embodiments provide an electrical junction box that can enhance reliability in connection between terminal metals and a circuit board.

An electrical junction box in accordance with an exemplary embodiment includes: a casing; a circuit board contained in the casing; a plurality of fuse side terminal metals including board connecting portions electrically coupled to the circuit board, and terminal portions adapted to detachably receive a mating member in a direction along a surface of the circuit board; and a holder for holding in alignment the plurality of fuse side terminal metals in an alignment manner. At least one of the plurality of fuse side terminal metals and the holder is provided with a leg that projects toward the circuit board and is disposed forward of the board connecting portions in a direction of the mating members. The circuit board is provided with an engaging portion that engages the leg.

According to the present invention, when the mating member is attached to and detached from the terminal metal, the force applied to the terminal metal is transmitted to the leg before the force is transmitted to the board connecting portion. The force transmitted to the leg is transmitted through the engaging portion to the circuit board and is released to the circuit board. Consequently, because it is possible to restrain the force from being transmitted to the board connecting portion, it is possible to restrain the force from being applied to the connection portions between the circuit board and the board connecting portion. As a result, it is possible to enhance reliability in the connection between the terminal metal and the circuit board.

The following constructions are preferable as embodiments.

The engaging portion of the circuit board may be a through-hole that passes the circuit board in a thickness direction of the circuit board at a position corresponding to the leg and the leg may be inserted into the through-hole.

According to the above construction, it is possible to engage the leg with the circuit board by a simple construction in which the through-hole is formed in the circuit board.

The leg may be integrally formed with the terminal metal and may be electrically connected to the circuit board.

According to the above construction, it is possible to further enhance reliability in connection between the terminal metal and the circuit board, because the leg in addition to the board connecting portion is electrically connected to the circuit board.

The leg may be provided on the holder.

According to the above construction, the force applied to the terminal metal is released through the leg provided on the holder to the circuit board. Thus, it is possible to prevent a misalignment between the plural terminal metals supported on the holder.

The plural terminal portions of the plurality of fuse side terminal metals may be juxtaposed in a direction in parallel to a surface of the circuit board.

According to the above construction, it is possible to reduce a height of the electrical junction box in the thickness direction in comparison with the case where the terminal portions are arranged on a plurality of layers in the thickness direction of the circuit board.

The board connection portion may be provided with a strain relief portion bent in a direction intersecting an extending direction of the board connecting portion.

According to the above construction, it is possible to absorb the force by deflection of the strain relief portion, even if any force is applied to the board connecting portion. Thus, because it is possible to restrain the force from being applied to the connection portions between the board connecting portion and the circuit board, it is possible to further enhance reliability in connection between the terminal metal and the circuit board.

The terminal portion of the terminal metal may be contained in the casing, and a receiving section adapted to mount the mating member may be integrated with the casing.

According to the above construction, it is possible to simplify a producing process of the electrical junction box, because a step of assembling the receiving section to the casing is not required.

According to the exemplary embodiments, it is possible to enhance reliability in connection between the terminal metal and the circuit board.

BRIEF DESCRIPTION OF THE DRAWINGS

FIG. 9 is a side elevation view of a holder and a fuse side terminal metal, illustrating the fuse side terminal metal being mounted on the holder.

FIG. 10 is a side elevation view of the holder and fuse side terminal metal, illustrating the fuse side terminal metal being mounted on the holder and showing a different side in FIG. 9.

FIG. 11 is a plan view of the holder and fuse side terminal metal, illustrating the fuse side terminal metal being mounted on the holder.

FIG. 12 is a longitudinal section view of the holder and fuse side terminal metal taken along lines C-C in FIG. 11.

FIG. 13 is a front elevation view of the holder and fuse side terminal metal, illustrating the fuse side terminal metal being mounted on the holder.

FIG. 14 is a perspective view of the holder and fuse side terminal metal, illustrating the fuse side terminal metal being mounted on the holder.

FIG. 15 is a rear elevation view of the holder and fuse side terminal metal, illustrating the fuse side terminal metal being mounted on the holder.

FIG. 16 is a longitudinal section view of the holder and fuse side terminal metal taken along lines D-D in FIG. 15.

FIG. 17 is a bottom view of the holder and fuse side terminal metal, illustrating the fuse side terminal metal being mounted on the holder.

FIG. 18 is a side elevation view of the fuse side terminal metal.

FIG. 19 is a perspective view of the fuse side elevation view.

FIG. 20 is a plan view of the fuse side terminal metal.

FIG. 21 is a partially broken side elevation view of a holder and a fuse side terminal metal in a second embodiment of the electrical junction box in accordance with the present invention, illustrating the fuse side terminal metal being mounted on the holder.

DETAILED DESCRIPTION OF EMBODIMENTS

First Embodiment

Referring now to FIGS. 1 to 20, a first embodiment in which the present invention is applied to an electrical junction box 10 to be mounted in a motor vehicle will be described below. The electrical junction box 10 is connected between a power source (not shown), such as a battery, and on-vehicle electrical components (not shown), such as head lamps and wipers to switch on and off the on-vehicle electrical components.

Figure 1:
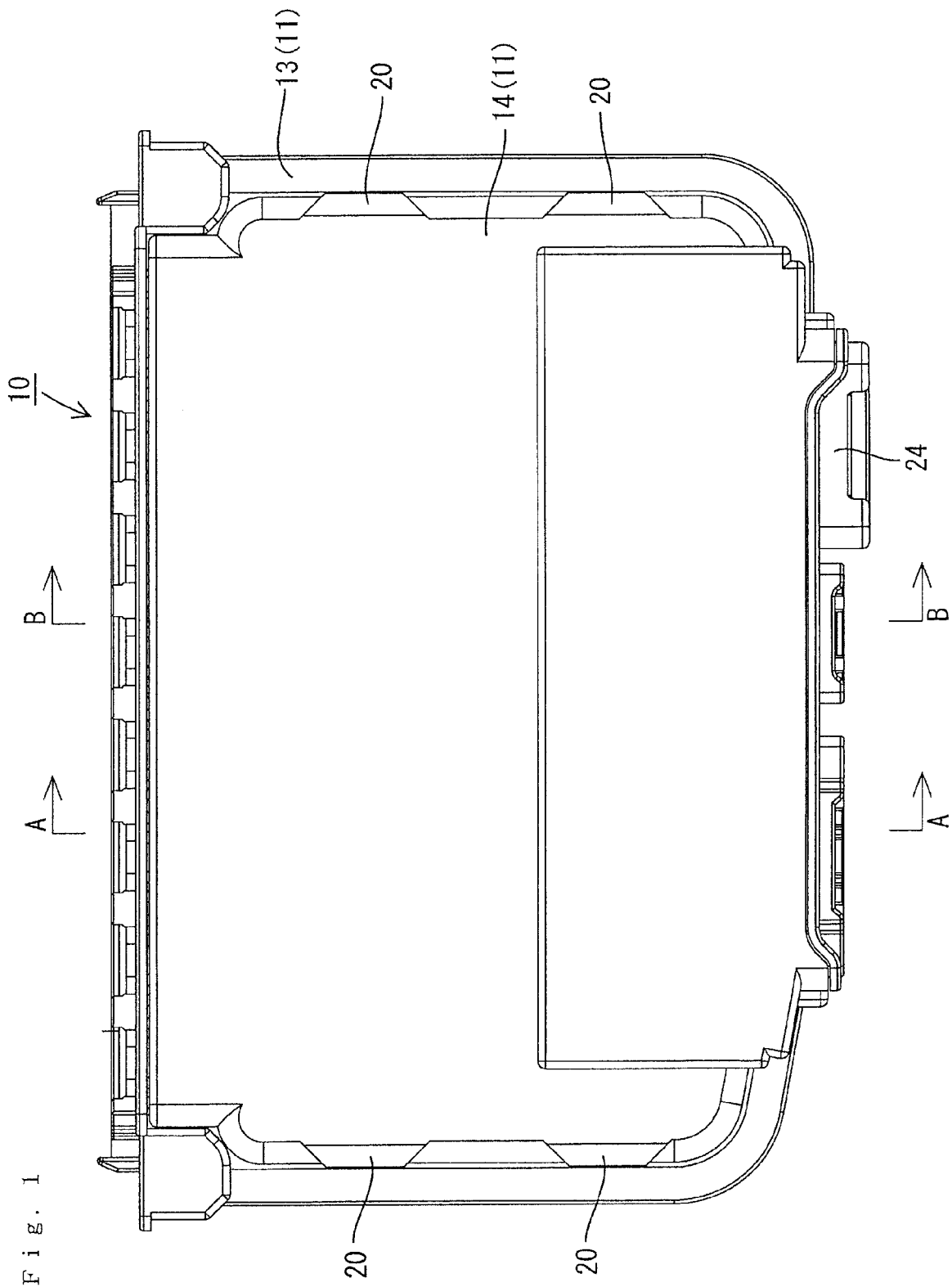
FIG. 1 is a front elevation view of a first embodiment of an electrical junction box in accordance with the present invention.

In the description hereinafter, an upper side in FIG. 1 defines "an upper part or direction", a lower side in FIG. 1 defines "a lower part or direction". A right side in FIG. 1 defines "a right part or direction" and a left side in FIG. 1 defines "a left part or direction". A foreside in a direction penetrating a paper in FIG. 1 defines "a front side" and an inner side in the direction penetrating the paper in FIG. 1 defines "a rear side".

(Casing 11)

Figure 3:
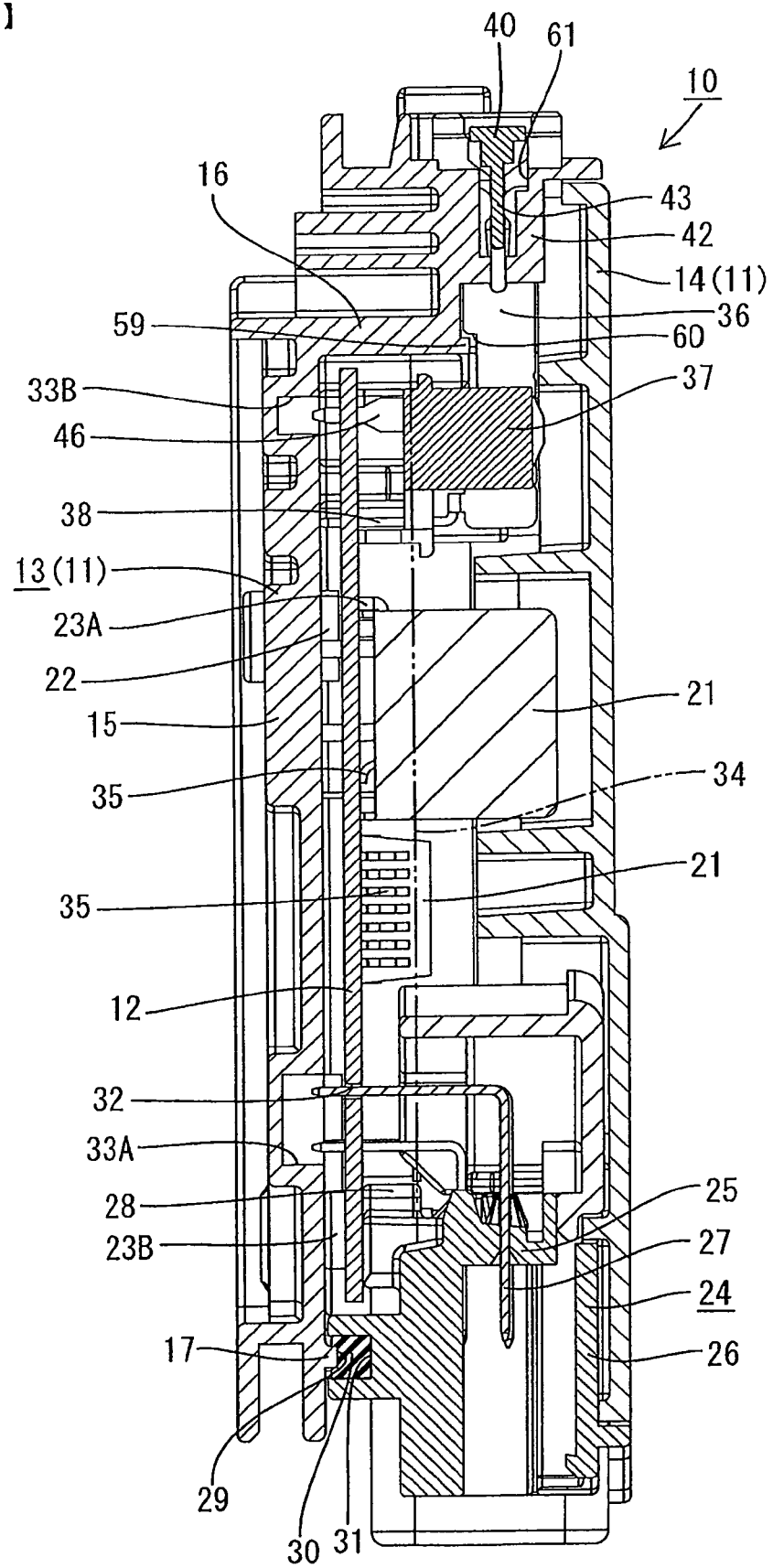
FIG. 3 is a cross section view of the electrical junction box taken along lines A-A in FIG. 1.

As shown in FIG. 3, the electrical junction box 10 contains a circuit board 12 in a flat casing 11. The casing 11 includes a casing body 13 made of a synthetic resin material and having an opening at a front side (a right side in FIG. 3) and a cover 14 made of a synthetic resin material and closing the opening in the casing body 13. As shown in FIG. 3, the electrical junction box 10 is mounted in an engine compartment in a motor vehicle (not shown) so that the circuit board 12 stands up in a vertical direction.

Figure 5:
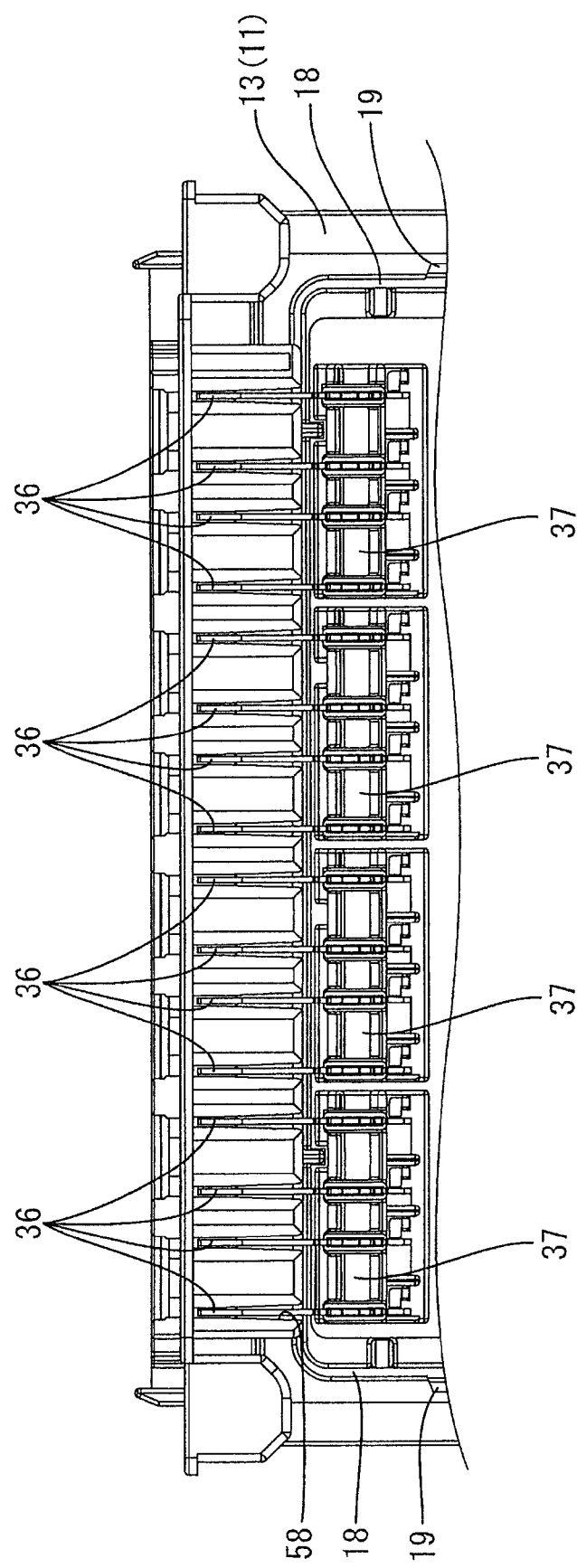
FIG. 5 is an enlarged front elevation view of a part of the electrical junction box, illustrating the box from which the cover is removed in FIG. 1.

As shown in FIG. 3, the casing body 13 is formed into a shallow container. The casing body 13 includes a rear wall 15 at a rear side (a left side in FIG. 3), an upper wall 16 at an upper side, and a lower wall 17 at a lower side. As shown in FIG. 5, the casing body 13 is provided on right and left sides of the rear wall 15 with a pair of side walls 18 projecting from the rear wall 15 to a front side (a foreside in a direction penetrating a paper in FIG. 5).

The cover 14 is attached to the casing body 13, when a plurality of lock portions 19 (FIG. 6), provided on an outer side surface of the side wall 18 of the casing body 13, are elastically engaged with a plurality of lock-receiving portions 20 (FIGS. 1 and 2) of the cover 14, provided on positions corresponding to the lock portions 19.

(Circuit Board 12)

As shown in FIG. 3, the circuit board 12 is provided on a surface with electrically conductive paths (not shown) formed by means of a printed wiring technique. Electronic components 21 are electrically connected to the electrically conductive paths by, for example, soldering. A thick film board may be formed by laminating a plurality of insulation boards on which the electrically conductive paths are formed.

The casing body 13 is provided on the rear wall 15 with support bosses 22 that project toward a front side (a right side in FIG. 3) to support the circuit board 12 from a rear side (a left side in FIG. 3). The circuit board 12 is mounted on the front surfaces (right surfaces in FIG. 3) of the support bosses 22 and is spaced away from the rear wall 15 of the casing body 13 to be overlaid on the rear wall 15. The circuit board 12 and casing body 13 are secured to the support bosses 22 by screwing bolts 23A through the circuit board 12 to the support bosses 22.

An elongated connector housing 24 made of a synthetic resin material is disposed at a relatively lower end with respect to the circuit board 12 in FIG. 3. In the present embodiment, the connector housing 24 serves as a board connector to be connected to the circuit board 12. The connector housing 24 includes a base 25, a hood section 26 adapted to be coupled to a mating connector (not shown) and has an opening directed downward from the base 25, as shown in FIG. 3. Connector terminals 27 pass through the base 25 in a vertical direction to project into the hood section 26, as shown in FIG. 3.

As shown in FIG. 3, the connector housing 24 is provided with a bolt-receiving portion 28. A bolt 23B passing through the circuit board 12 from its rear side (a left side in FIG. 3) is screwed into the bolt-receiving portion 28. When the bolt 23B is screwed in the bolt-receiving portion 28, the connector housing 24 is secured to the circuit board 12.

A lower wall 17 of the casing body 13 is depressed toward the rear wall 15 to define a receiving recess 29 for containing the connector housing 24. The connector housing 24 is contained in the receiving recess 29. The connector housing 24 is provided in a position opposed to the receiving recess 29 with a groove 31 for containing a packing 30. When the packing 30 is contained in the groove 31 and is brought into close contact with a clearance between an inner surface of the groove 31 and the receiving recess 29, a clearance between the casing body 13 and the connector housing 24 is sealed.

As shown in FIG. 3, an end of each connector terminal 27 projects upward from the base 25. The end is bent toward the circuit board 12 by about a right angle and inserted into each first through-hole 32 in the circuit board 12 to be electrically connected to the electrically conductive paths on the circuit board 12 by, for example, soldering. The connector terminals 27 are juxtaposed on two layers in front and rear directions (right and left directions in FIG. 3) and juxtaposed on a plurality of arrays in the right and left directions (the direction penetrating the paper in FIG. 3).

The rear wall 15 of the casing body 13 is provided at positions corresponding to the connector terminals 27 with a clearance recess 33A depressed toward the rear side (the left side in FIG. 3) to escape from ends of the connector terminals 27.

As shown by a two-dot chain line in FIG. 3, a seal member 34 made of a synthetic resin material is filled in a space enclosed by the connector housing 24 and the rear wall 15, side wall 18, and upper wall 16 of the casing body 13. The seal member 34 is filled in the clearance recess 33A in the casing body 13 and into a space between the circuit board 12 and the rear wall 15 of the casing body 13. The circuit board 12 is embedded in the seal member 34. Furthermore, the seal member 34 is filled to a level in height enough to cover lead terminals 35 of the electronic components 21.

Fuse side terminal metals 36 (corresponding to terminal metals) are disposed at a relatively upper end in FIG. 3 on the circuit board 12. The fuse side terminal metals 36 are formed by pressing a metal sheet. As shown in FIG. 5, the fuse side terminal metals 36 are juxtaposed in the right and left directions. A plurality of fuse side terminal metals 36 are arrayed on and held in holders 37 made of a synthetic resin material.

Each of the fuse side terminal metals 36 includes a board connecting portion 38 to be connected to the circuit board 12. Each board connecting portion 38 is inserted into and solder to each second through-hole 39 provided in the circuit board 12 to be electrically connected to the electrically conductive paths on the circuit board 12.

Each of the fuse side terminal metals includes a terminal portion 41 to be connected to each fuse 40 (corresponding to a mating member) described after. The terminal portion 41 extends along the surface of the circuit board 12. Each terminal portion 41 is contained in a fuse-receiving section 42 (corresponding to a receiving section) integrated with the upper wall 16 of the casing body 13. The fuse-receiving section 42 can contain the fuses 40 as well as the terminal portions 41. When the fuses 40 are inserted into the fuse-receiving section 42, the fuse terminals 43 of the fuses 40 are electrically connected to the terminal portions 41 of the fuse side terminal metals 36.

(Connection Structure between the Fuse Side Terminal Metals 36 and the Circuit Board 12)

FIGS. 18 to 20 show a construction of each of the fuse side terminal metals 36. As shown in FIG. 18, the terminal portion 41 to be connected to the fuse terminal 43 of the fuse 40 is provided on left ends (FIG. 18) of the fuse side terminal metal 36. The terminal portions 41 are juxtaposed on the fuse side terminal metal 36 in the vertical direction in FIG. 18 and include pairs of arms 44 extending to the left side. The arms 44 can move in the vertical direction in FIG. 18 to widen a gap between them. When the fuse terminal 43 is pinched between the pairs of arms 44, the fuse side terminal metal 36 is electrically connected to the fuse 40.

Each of the fuse side terminal metals 36 is provided on a right end in FIG. 18 with a board connecting portion 38 extending downward. As shown in FIGS. 19 and 20, the board connecting portion 38 is provided with a strain relief portion 45 bent in a direction intersecting an extending direction of the board connecting portion 38. In more detail, as shown in FIG. 19, after the strain relief portion 45 is bent in a direction intersecting a surface of the fuse side terminal metal 36, the strain relief portion 45 is bent downward from an end edge at a left inner wall side in FIG. 19 to form the board connecting portion 38. Thus, the fuse side terminal metal 36 and board connecting portion 38 are arranged so that the surfaces of the fuse side terminal metal 36 and board connecting portion 38 intersects each other.

Each of the fuse side terminal metals 36 is provided on a position between the terminal portions 41 and the board connecting portion 38 with a leg 46 extending downward in FIG. 18. That is, the leg 46 is provided on a fore position with respect to the board connecting portion 38 in a detachable direction of the fuse 40. A length of the leg 46 projecting downward is set to be substantially equal to a length of the board connecting portion 38 projecting downward. A width of an upper end of the leg 46 in a lateral direction in FIG. 18 is greater than that of a lower end of the leg 46.

As shown in FIGS. 9 to 17, the fuse side terminal metals 36 are supported in the holders 37. A plurality of fuse side terminal metals 36 (four metals in the present embodiment) are arrayed on each holder 37 in the vertical direction in FIG. 11.

As shown in FIG. 14, each holder 37 includes a base table 47, a plurality of pairs of pinch walls 48 (four pairs in the present embodiment) that project upward from the base table 47 in FIG. 14 and pinch the fuse side terminal metals 36, and a plurality of supports 49 that project downward from the base table 47 in FIG. 14 and contact with the surface of the circuit board 12 to support the holder 37.

As shown in FIG. 11, four pairs of pinch walls 48 are provided on the holder 37 in the vertical direction. The pair of pinch walls 48 are opposed to each other. Each of the fuse side terminal metals 36 is fitted into and pinched in a gap between each pair of pinch walls 48 (see FIGS. 13 and 15).

As shown in FIG. 14, the base table 47 is provided with pinch ribs 50 that project in a vertical direction and extend in a direction intersecting a thickness direction of the pinch walls 48. Because the pinch walls 48 are reinforced by the pinch ribs 50, the pinch walls 48 can surely pinch the fuse side terminal metals 36.

As shown in FIG. 16, each pinch wall 48 is provided on each of upper and lower ends with a protrusion 51 that projects in an opposing direction of the pair of pinch walls 48. The protrusions 51 can positively pinch the fuse side terminal metals 36 between the pair of pinch walls 48.

As shown in FIG. 12, the base table 47 is provided on a position between the pair of pinch walls 48 with engaging protrusions 52 that project upward. On the other hand, each of the fuse side terminal metals 36 is provided with an engaging recess 53 that is depressed upward, as shown in FIG. 12. Each engaging recess 53 is disposed at a position corresponding to each engaging protrusion 52 of the base table 47 when the fuse side terminal metal 36 is pinched between the pair of pinch walls 48. As shown in FIG. 18, the engaging recess 53 is provided on an inner surface with a plurality of blocking protrusions 54 that project inward. As shown in FIG. 12, when the engaging protrusion 52 is fitted into the engaging recess 53, the blocking protrusions 54 bite the engaging protrusion 52. Thus, it is possible to securely prevent the fuse side terminal metal 36 from coming out of the holder 37.

As shown in FIG. 17, a first receiving aperture 55 and a second receiving aperture 56 are provided in the base table 47 so that the apertures 55 and 56 pass the base table 47 in a direction of penetrating the paper in FIG. 17. When the fuse side terminal metals 36 are pinched between the pairs of pinch walls 48, the board connecting portions 38 of the fuse side terminal metals 36 are inserted into the first receiving apertures 55 and the legs 46 of the fuse side terminal metals 36 are inserted into the second receiving apertures 56.

Figure 8:
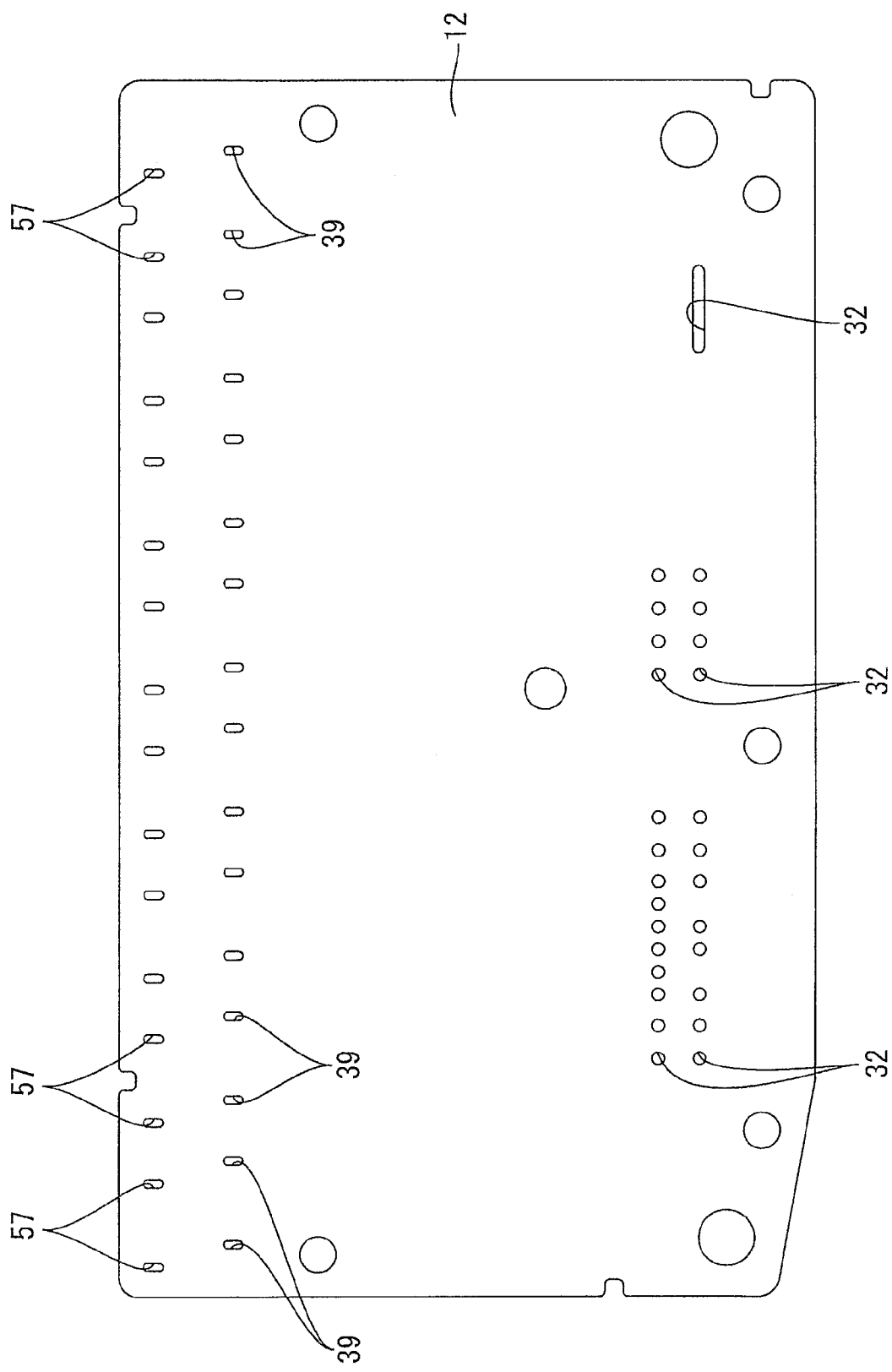
FIG. 8 is a front elevation view of a circuit board.

As shown in FIG. 8, the circuit board 12 is provided in a relatively upper end position with a plurality of third through-holes 57 (corresponding to engaging portions and through-holes) into which the legs 46 of the fuse side terminal metals 36 are inserted. The third through-holes 57 pass the circuit board 12 in its thickness direction and are juxtaposed in right and left directions (right and left directions in FIG. 8). Also, the circuit board 12 is provided in a position lower than the third through-holes 57 with a plurality of second through-holes 39 into which the board connecting portions 38 of the fuse side terminal metals 36 are inserted. The second through-holes 39 pass the circuit board 12 in its thickness direction and are juxtaposed in right and left directions. Although the details are not shown in FIG. 8, electrically conductive layers are formed on inner surfaces of the second and third through-holes 39 and 57 by a known method to be electrically connected to the electrically conductive paths on the circuit board 12.

Figure 4:
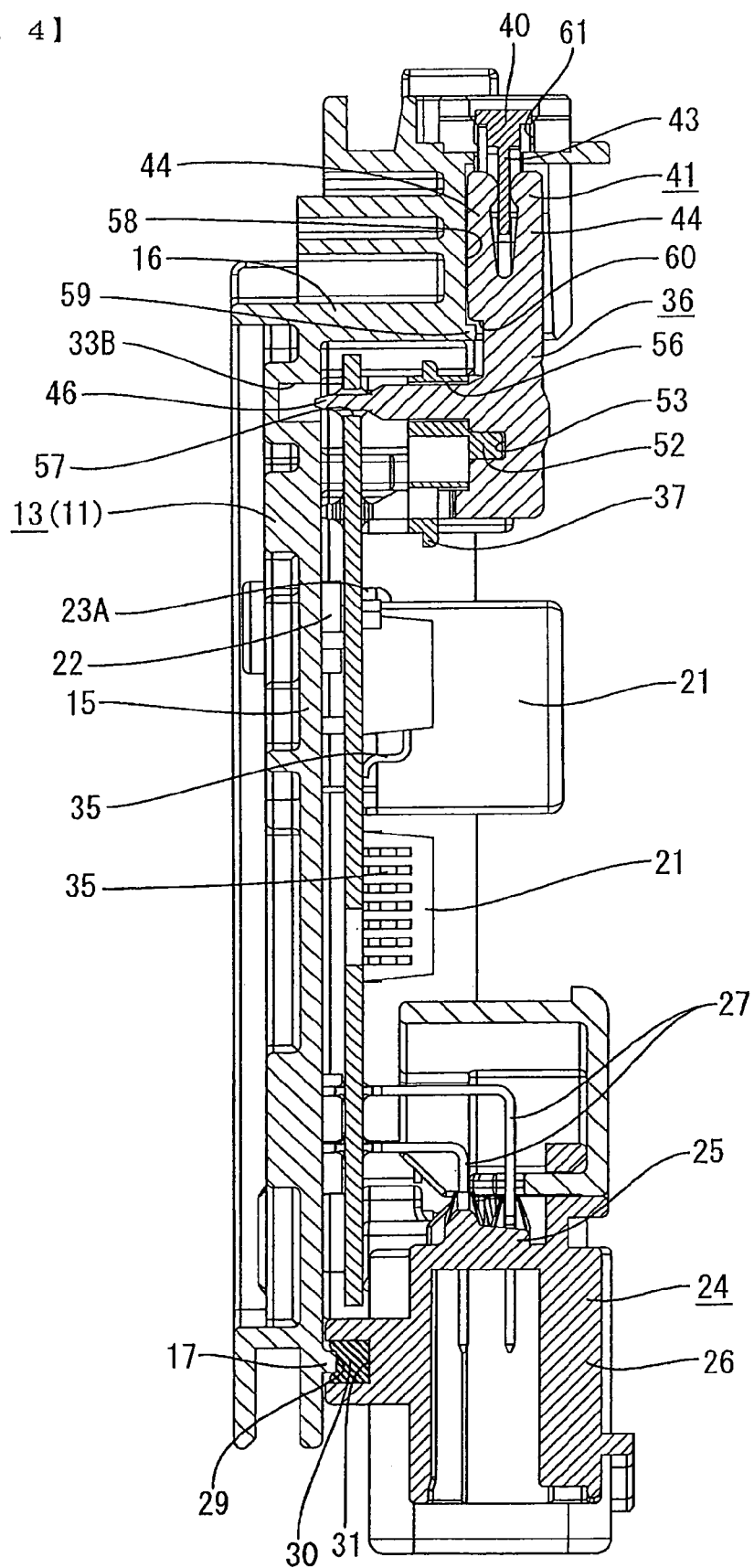
FIG. 4 is a cross section view of the electrical junction box taken along lines B-B in FIG. 1, illustrating the box from which a cover is removed in FIG. 3.
Figure 6:
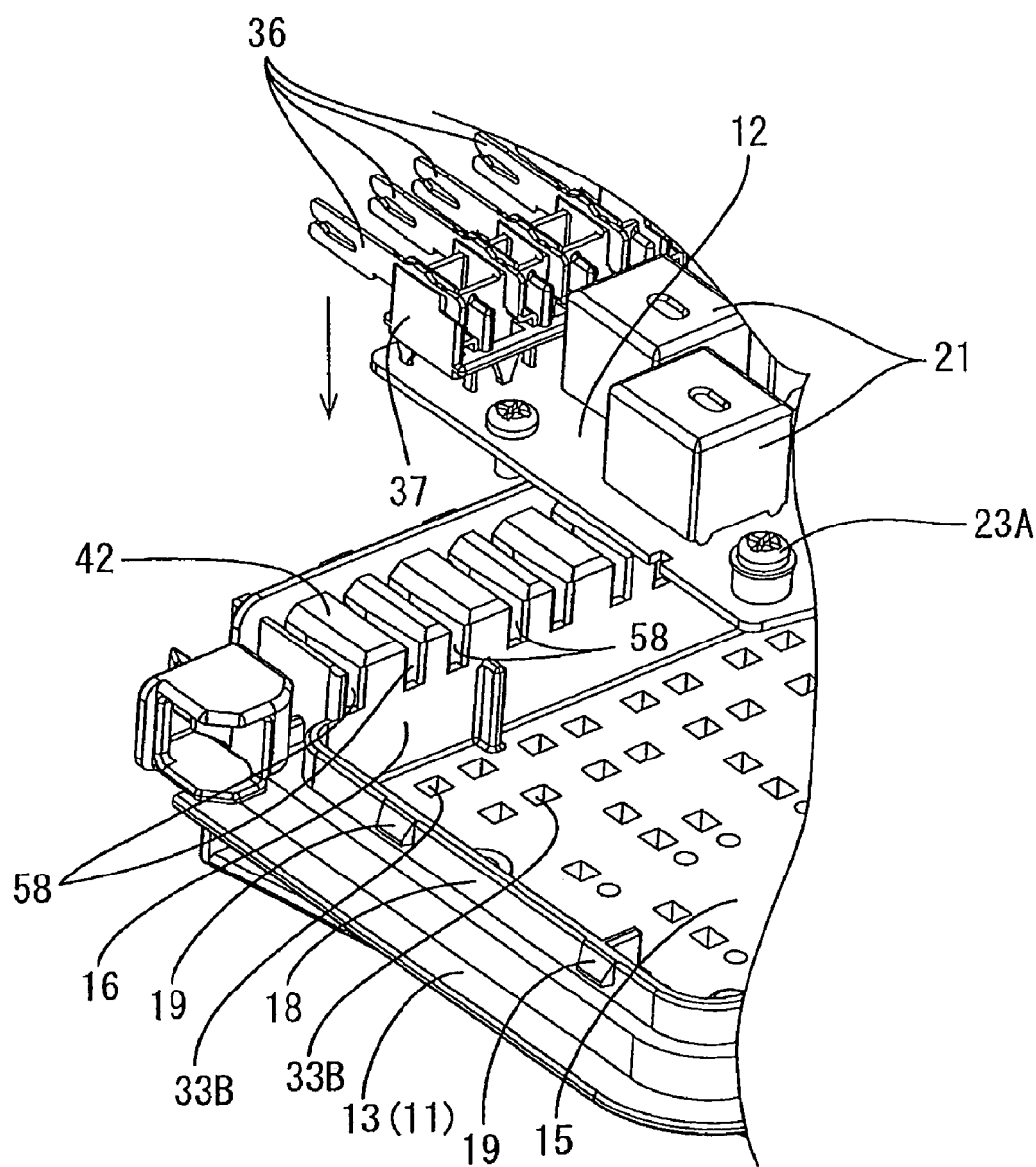
FIG. 6 is an enlarged and exploded perspective view of a part of the electrical junction box, illustrating the box from which the cover is removed in FIG. 1.

As shown in FIG. 4, the legs 46 are inserted into and soldered to the second through-holes 39 in the circuit board 12. Thus, the legs 46 are secured to the circuit board 12 and electrically connected to the electrically conductive paths on the circuit board 12. The board connecting portions 38 are inserted into and soldered to the third through-holes 57 in the circuit board 12. Thus, the board connecting portions 38 are secured to the circuit board 12 and electrically connected to the electrically conductive paths on the circuit board 12. Under this condition, as shown in FIG. 6, distal ends of the supports 49 contact with the surface of the circuit board 12. The rear wall 15 of the casing body 13 is provided with a depressed clearance recess 33 for escaping from distal ends of the legs 46 and board connecting portions 38. The seal member 34 is also filled within the clearance recess 33.

As shown in FIG. 5, a plurality of holders 37 (four holders in the present embodiment), on which the fuse side terminal metals 36 are arranged, are juxtaposed on the surface of the circuit board 12 in the right and left directions (the right and left directions in FIG. 5) so that the terminal portions 41 project upward. Thus, the terminal portions 41 are arranged substantially in parallel to the surface of the circuit board 12.

As shown in FIG. 6, the fuse-receiving section 42 is disposed on the upper wall 16 of the casing body 13 so that openings in the section 42 are directed to a front side (upward in FIG. 6). The fuse-receiving section 42 is provided with a plurality of receiving grooves 58 for containing the terminal portions 41 of the fuse side terminal metals 36. The terminal portions 41 are contained in the receiving groove 58 from a direction shown by an arrow in FIG. 6.

As shown in FIG. 4, a rib 59 that projects toward a front side (a right side in FIG. 4) is provided on a lower end of a wall surface of each receiving groove 58 at a rear side (a left side in FIG. 4). On the other hand, the terminal portion 41 of each fuse side terminal metal 36 is provided at a position corresponding to the rib 59 with a stepped portion 60 (FIG. 18) that is depressed at a front side (a right side in FIG. 4), when the terminal portion 41 is contained in the receiving groove 58.

Figure 2:
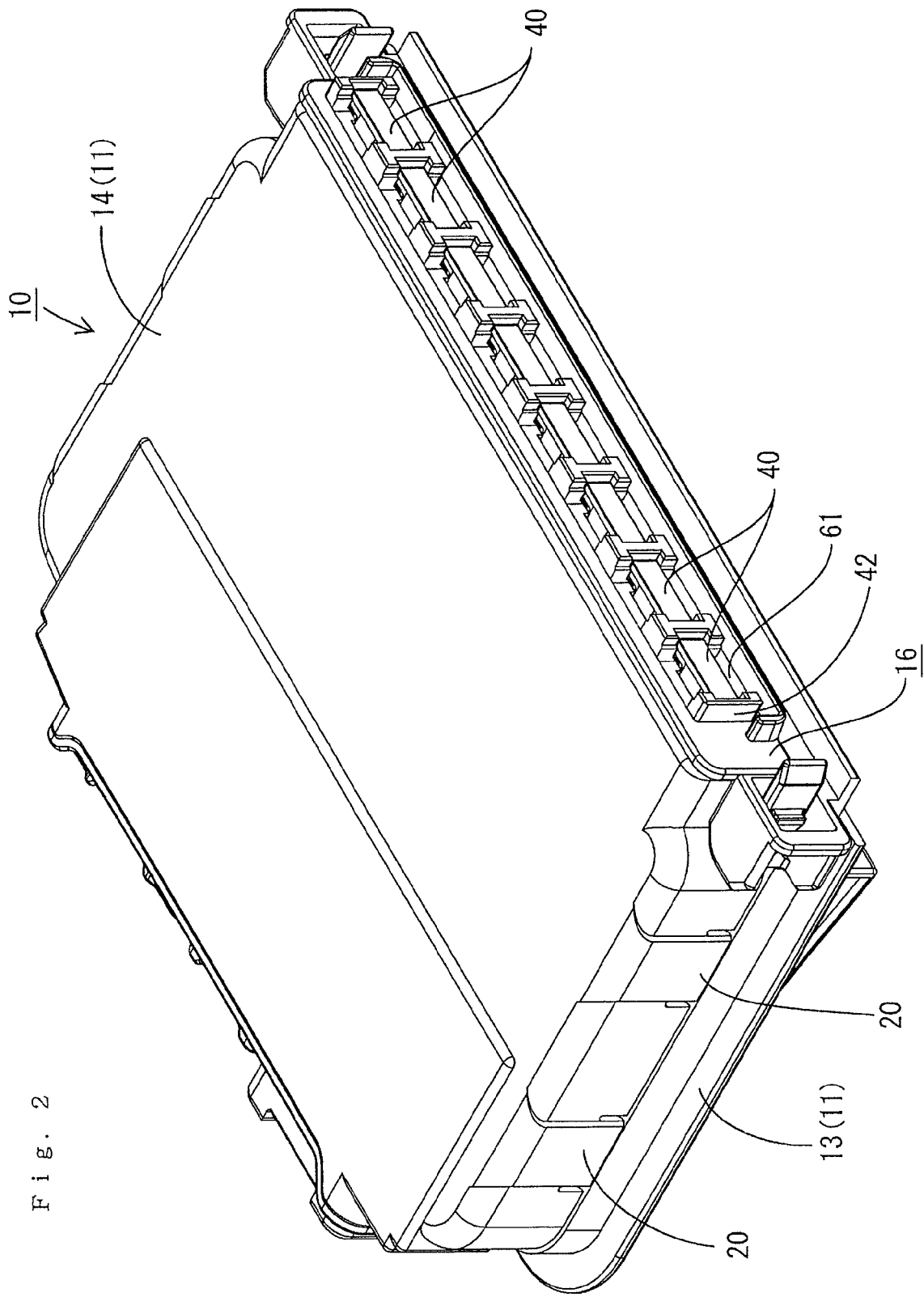
FIG. 2 is a perspective view of the electrical junction box shown in FIG. 1.
Figure 7:
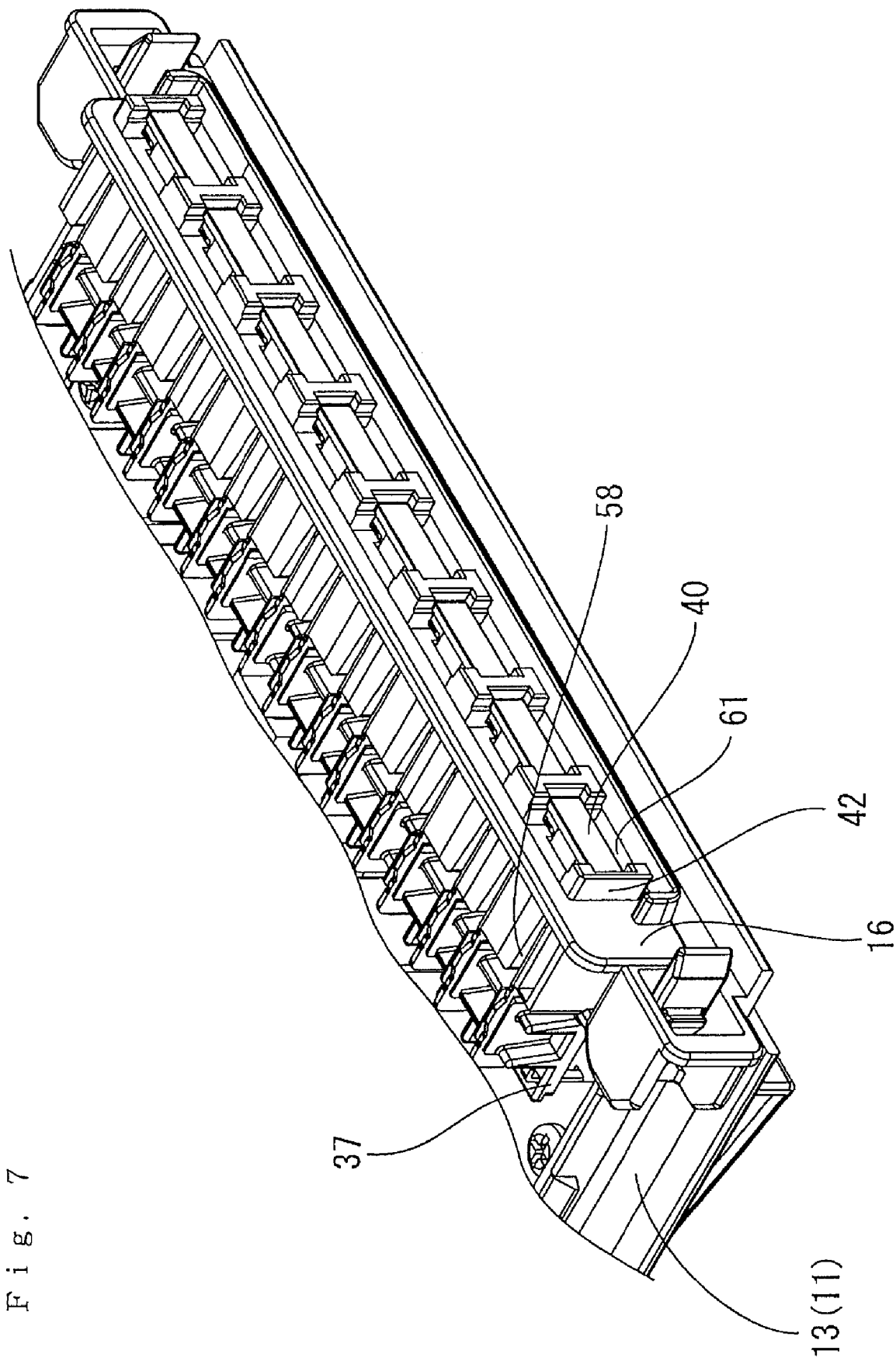
FIG. 7 is an enlarged perspective view of a part of the electrical junction box, illustrating the box from which the cover is removed in FIG. 1.

As shown in FIG. 3, the fuse-receiving section 42 is provided with an opening 61 that is directed upward (upward in FIG. 3). The fuse 40 is detachably fitted into the opening 61 from an upper side. Because the circuit board 12 is disposed in the casing 11 so that the circuit board 12 stands up in the vertical direction, the fuse 40 can be inserted into the opening 61 along the surface of the circuit board 12. As shown in FIGS. 2 and 7, the opening 61 is elongated in right and left directions.

As shown in FIGS. 2 and 7, the fuse 40 is formed into a flat configuration. The fuse 40 is disposed in the opening 61 so that a flat surface of the fuse 40 is opposed to the circuit board 12. Thus, it is possible to reduce a height of the electrical junction box 10, in comparison with a case where the fuse 40 is disposed on the circuit board 12 so that the flat surface of the fuse 40 intersects the surface of the circuit board 12.

Next, an operation and effects of the present embodiment will be described below. As shown in FIG. 3, when the fuse 40 is mounted on the opening 61 in the fuse-receiving section 42 from an upper side, a downward force is applied to the terminal portion 41. Then, as shown in FIG. 4, the stepped portion 60 disposed on a lower part of the terminal portion 41 contacts with the rib 59 provided on the upper wall 16 of the casing body 13 from an upper side. Consequently, the force applied to the terminal portion 41 is released through the rib 59 to the casing body 13.

Also, the force applied to the terminal portion 41 is transmitted to the leg 46. The leg 46 is inserted into and soldered to the third through-hole 57 in the circuit board 12. Thus, the force transmitted to the leg 46 is transmitted to the circuit board 12. The circuit board 12 and casing body 13 are fixed to each other by screwing the bolt 23A through the circuit board 12 into the support boss 22. Thus, the force transmitted to the circuit board 12 is released to the casing body 13.

Accordingly, since, when the fuse 40 is mounted on the fuse-receiving section 42, the downward force applied to the terminal portion 41 is released to the casing body 13, it is possible to restrain the force from being transmitted to the board connecting portion 38 provided on a lower part of the fuse side terminal metal 36. Thus, because it is possible to restrain the downward force from being applied to connection portions between the fuse side terminal metal 36 and the circuit board 12, it is possible to enhance reliability in electrical connection between the fuse side terminal metal 36 and the circuit board 12.

On the other hand, when the fuse 40 is removed from the fuse-receiving section 42, an upward force is applied to the terminal portion 41. Then, the upward force applied to the terminal portion 41 is transmitted to the leg 46. The force transmitted to the leg 46 is released to the casing body 13, as in the case of the above operation.

Thus, when the fuse 40 is removed from the fuse-receiving section 42, the upward force applied to the terminal portion 41 is released to the casing body 13, it is possible to restrain the upward force from being transmitted to the board connecting portion 38 provided on the lower part of the fuse side terminal metal 36. Thus, because it is possible to restrain the upward force from being applied to the connection portions between the fuse side terminal metal 36 and the circuit board 12, it is possible to enhance reliability in electrical connection between the fuse side terminal metal 36 and the circuit board 12.

As described above, according to the present embodiment, when the fuse 40 is attached to and detached from the fuse-receiving section 42, the force applied to the fuse side terminal metal 36 is transmitted to the leg 46 before the force is transmitted to the board connecting portion 38. The force transmitted to the leg 46 is transmitted through the third through-hole 57 to the circuit board 12, is released to the casing body 13, and is released to the casing 11. Consequently, because it is possible to restrain the force from being transmitted to the board connecting portion 38, it is possible to restrain the force from being applied to the connection portions between the circuit board 12 and the board connecting portion 38. In the results, it is possible to enhance reliability in connection between the terminal metal 36 and the circuit board 12.

According to the present embodiment, because the leg 46 in addition to the board connecting portion 38 is electrically connected to the circuit board 12, it is possible to further enhance reliability in connection between the fuse side terminal metal 36 and the circuit board 12.

Furthermore, in the present embodiment, the board connecting portion 38 is provided with the strain relief portion 45 bent in the direction intersecting the extending direction of the board connecting portion 38. Thus, even if any force is applied to the board connecting portion 38, the force will be absorbed by deflection of the strain relief portion 45. Accordingly, because it is possible to restrain the force from being applied to the connection portions between the board connecting portion 38 and the circuit board 12, it is possible to further enhance reliability in connection between the terminal metal and the circuit board 12.

Also, in the present embodiment, the plural fuse side terminal metals 36 are disposed on the holders 37 so that the plural terminal portions 41 are arranged in the direction in parallel to the surface of the circuit board 12. Thus, it is possible to reduce a height of the electrical junction box 10 in the thickness direction of the circuit board 12 in comparison with the case where the terminal portions 41 are arranged on the plural layers in the thickness direction of the circuit board 12.

Also, according to the present embodiment, the leg 46 is secured to the circuit board 12 by inserting the leg 46 into the third through-hole 57. Thus, it is possible to secure the leg 46 to the circuit board 12 by a simple structure in which the through-hole is formed in the circuit board 12.

Furthermore, in the present embodiment, the terminal portions 41 of the fuse side terminal metals 36 are contained in the casing body 13 and the fuse-receiving section 42, on which the fuses 40 can be mounted, are integrated with the casing body 13. Thus, because a step of assembling the fuse-receiving section 42 to the casing 11 is not required, it is possible to simplify a producing process of the electrical junction box 10, in comparison with the case where the fuse-receiving section 42 is formed individually from the casing body 13.

Second Embodiment

A second embodiment will be described by referring to FIGS. 21. As shown in FIGS. 21, in the second embodiment, the base table 47 of the holder 37 is provided with the leg 46 projecting toward the circuit board 12 (downward in FIGS. 21).

In the second embodiment, two board connecting portions 38 project toward the circuit board 12 from a single fuse side terminal metal 36.

When the fuse side terminal metal 36 is disposed on the holder 37, the leg 62 is provided at the side of the terminal portion 41 nearer than the board connecting portion 38. That is, the leg 62 is provided on a fore position with respect to the board connecting portion 38 in the detachable direction of the fuse 40.

A height of the leg 62 projecting from the base table 47 is set to be greater than the support 49 and to be smaller than the board connecting portion 38. As shown in FIG. 23, the leg 62 is forced into a through-hole 63 (corresponding to an engaging portion) provided in the circuit board 12.

Because the other constructions except the above constructions in the second embodiment are the same as those in the first embodiment, duplicating explanations are omitted by giving the same signs to the same members.

According to the second embodiment, the leg 62 is provided on the holder 37. Thus, the force applied through the terminal portion 41 to the fuse side terminal metal 36 when the fuse is inserted into or removed from the holder 37 is transmitted through the leg 62 to an inner wall of the through-hole 63 and is released to the circuit board 12. The force released to the circuit board 12 is released to the casing body 13, as described above. Thus, because the force applied to the fuse side terminal metal 36 is released through the holder 37 to the casing body 13, it is possible to prevent a misalignment among the plural fuse side terminal metals 36 supported by the holder 37.

Other Embodiments

It should be noted that the present invention is not limited to the embodiments described above and illustrated in the drawings. For example, the following embodiments will fall in the technical scope of the present invention.

(1) Although the terminal metals according to the present invention are the fuse side terminal metals 36 to be connected to the fuses 40 in the present embodiments, the present invention is not limited to these embodiments. The terminal metals according to the present invention may be constructed to be connected through wire harnesses to on-vehicle electrical parts or relays.

(2) Although each of the fuse side terminal metals 36 is provided with the leg 46 in the first embodiment while the holder 37 is provided with the leg 62 in the second embodiment, the present invention is not limited to these embodiments. The legs 46 and 62 may be provided on both of the fuse side terminal metals 36 and bolder 37.

(3) Although the engaging portions according to the present invention are the third through-holes 57 provided in the circuit board 12 in the present embodiments, the present invention is not limited to these embodiments. The engaging portions may be recesses provided in the circuit board 12. In this case, the legs 46 are contained in the recesses to engage inner walls of the recesses.

(4) Although the board connecting portion 38 is provided with the strain relief portion 45 in the present embodiments, the present invention is not limited to these embodiments. For example, in the case where the force applied to the fuse side terminal metals 36 are surely released to the circuit board 12 by the legs 46, the strain relief portion 45 may be omitted.

(5) Although the fuse-receiving section 42 is integrated with the casing body 13 in the present embodiments, the present invention is not limited to these embodiments. The fuse-receiving section 42 may be formed individually from the casing 11.

(6) Although the legs 46 are soldered to the electrically conductive paths on the circuit board 12 to be electrically connected to the paths after the legs 46 are inserted into the third through-holes 57 in the first embodiment, the present invention is not limited to this embodiment. The legs 46 may be forced into the third through-holes 57. Alternatively, each leg 45 may be provided on a distal end with an elastically deformable piece to form a press-fit terminal and the distal end of the leg 46 may be inserted into the third through-hole 57.

Also, the circuit board 12 may be provided with through-holes that are not electrically connected to the electrically conductive paths and the legs 46 may be inserted into the through-holes.

What is claimed is:

1. An electrical junction box comprising:
   a casing;
   a circuit board contained in the casing;
   a plurality of fuse side terminal metals including:
      board connecting portions electrically coupled to the circuit board, and
      terminal portions adapted to detachably receive a mating member in a direction substantially parallel to a surface of the circuit board; and
   a holder that holds the plurality of fuse side terminal metals in alignment;
   wherein at least one of the plurality of fuse side terminal metals and the holder is provided with a leg that projects toward the circuit board and is disposed between a corresponding board connection portion and a corresponding mating member, the circuit board being provided with an engaging portion that engages the leg; and
   wherein the board connection portions are provided with a strain relief portion disposed in a direction intersecting an extending direction of the board connecting portion.

2. An electrical junction box according to claim 1, wherein the engaging portion of the circuit board is a through-hole that passes through the circuit board in a thickness direction of the circuit board at a position corresponding to the leg, and the leg is inserted into the through-hole.

3. An electrical junction box according to claim 1, wherein the leg is integral with the at least one of the plurality of terminal metals and is electrically connected to the circuit board.

4. An electrical junction box according to claim 1, wherein the leg is provided on the holder.

5. An electrical junction box according to claim 1, wherein the terminal portions of the plurality of fuse side terminal metals are juxtaposed in a direction parallel to the surface of the circuit board.

6. An electrical junction box according to claim 1, wherein the terminal portions of the plurality of fuse side terminal metals are contained in the casing, and a receiving section adapted to mount the mating member is integral with the casing.

* * * * *